United States Patent [19]

Huntington et al.

[11] 4,107,671
[45] Aug. 15, 1978

[54] IMPROVED DIGITAL TO ANALOG CONVERTER PROVIDING SELF COMPENSATION TO OFFSET ERRORS

[75] Inventors: Robert Charles Huntington, Phoenix, Ariz.; James Everett Cooper, Jr., Woodland Hills, Calif.

[73] Assignee: Motorola, Inc., Schaumburg, Ill.

[21] Appl. No.: 719,550

[22] Filed: Sep. 1, 1976

[51] Int. Cl.² .......................................... H03K 13/02
[52] U.S. Cl. ..................... 340/347 DA; 340/347 CC; 340/347 M
[58] Field of Search .... 340/347 NT, 347 M, 347 AD, 340/347 DA, 347 C

[56] References Cited

U.S. PATENT DOCUMENTS

| | | | |
|---|---|---|---|
| 3,541,446 | 11/1970 | Prozeller | 340/347 NT |
| 3,646,545 | 2/1972 | Naydan et al. | 340/347 DA |
| 3,654,560 | 4/1972 | Cath et al. | 340/347 NT |
| 3,942,173 | 3/1976 | Wold | 340/347 CC |

OTHER PUBLICATIONS

Bares et al, Combined ADC-DAC, IBM Technical Disclosure Bulletin, vol. 10, No. 9, 2/1968, pp. 1372, 1373.
Grob, "Basic Television, Principles and Servicing," McGraw-Hill Book Co., 1954, pp. 331-333.
The Engineering Staff of Analog Devices, Inc., Analog-Digital Conversion Handbook, 6/1972, pp. I-42 to I-45; III-4.

*Primary Examiner*—Thomas J. Sloyan
*Attorney, Agent, or Firm*—Michael D. Bingham

[57] ABSTRACT

An apparatus and method are disclosed for converting digital input signals of either polarity to representative analog output signals. An internal synchronous counter is clocked to generate internal digital signals of the same code as the input digital signal which are compared with the input digital signal which is stored in a bank of latches. Upon coincidence therebetween, an inhibiting pulse is produced from a coincidence circuit for disabling a buffer-integrator circuit. During the time interval between the enabling of the counter and the inhibiting pulse, the buffer-integrator integrates a single polarity reference voltage provided thereto to establish an analog voltage representative of the stored digital signal. Sample and hold circuits periodically sample the output of the integrator circuit to update and provide the analog output. Self compensation for operational amplifier offsets is provided during each conversion cycle. The converter is suitable to be fabricated using CMOS technology on a single chip and requires no ladder network.

7 Claims, 9 Drawing Figures

| SIGN BIT | CYCLE | S1 | S2 | S3 | S4 | S5 | S6 | S7 | S8 | S9 | S10 | S31 | S32 |
|---|---|---|---|---|---|---|---|---|---|---|---|---|---|
| 0 | 1− | X |  |  |  | X |  | X |  | X | X | X |  |
| 1 | 1+ |  | X | X |  | X |  | X |  | X |  | X |  |
| * | 2 |  |  |  | X |  | X |  | X |  | X |  | X |
| * | 3 |  |  |  | X |  | X |  |  |  | X |  | X |

* DON'T CARE

| CYCLE | | S11 | S12 | S13 | S14 | S15 | S16 | S21 | S22 | S23 | S24 | S25 | S26 |
|---|---|---|---|---|---|---|---|---|---|---|---|---|---|
| 48-H 50-S | 3 |  | X |  |  | X | X | X |  | X | X |  |  |
| 48-H 50-H | 1+2 |  | X |  |  | X | X |  | X |  |  | X |  |
| 48-S 50-H | 3 | X |  | X | X |  |  |  | X |  |  | X | X |
| 48-H 50-H | 1+2 |  | X |  |  | X |  |  | X |  |  | X | X |

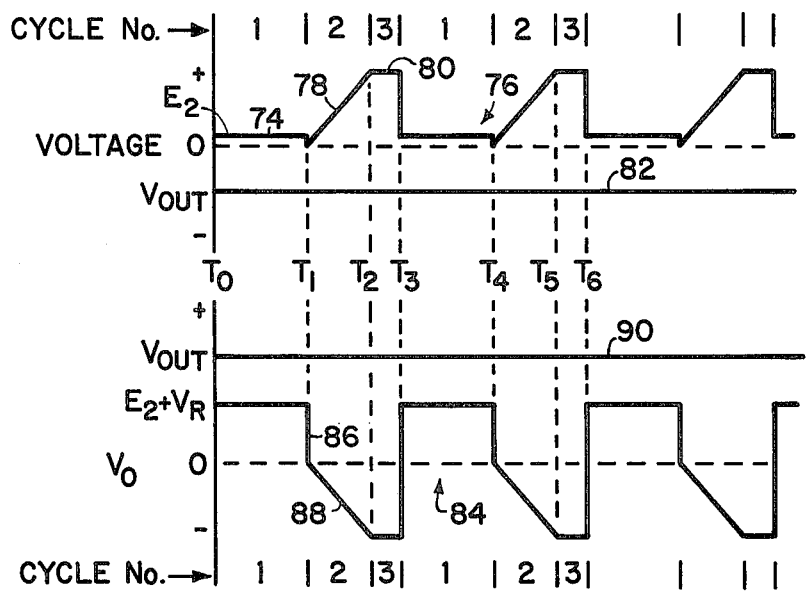
FIG. 7
FIG. 8
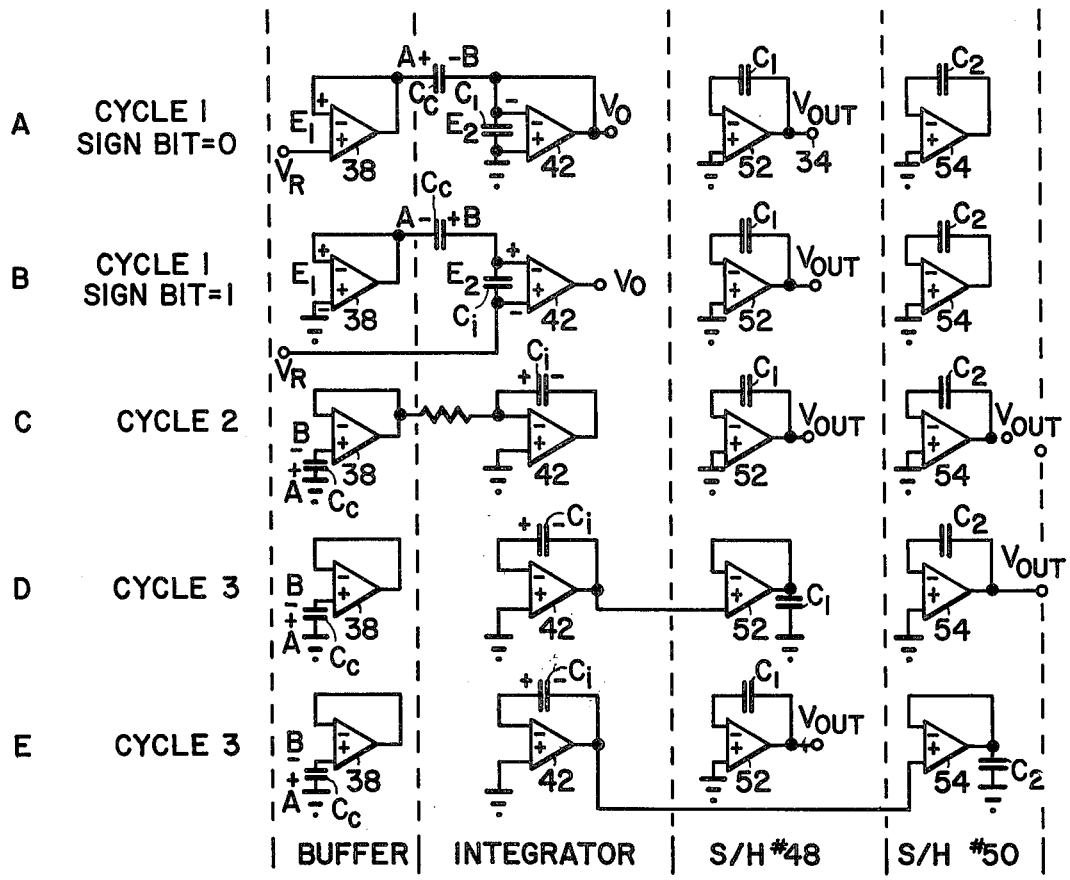
FIG. 9

IMPROVED DIGITAL TO ANALOG CONVERTER PROVIDING SELF COMPENSATION TO OFFSET ERRORS

BACKGROUND OF THE INVENTION

This invention relates to digital to analog (D/A) converters and more particularly to ladderless D/A converters suitable to be fabricated in monolithic form on a single chip utilizing CMOS technology.

The electronic field is replete with applications for D/A converter systems. For example, D/A converters may be used as peripheral units interfacing between microprocessors (MPU's), computers and other systems requiring real time analog voltage inputs. D/A converters are also required in applications where any type of digital number (BCD, binary, etc.) must be converted to a corresponding analog output.

Most contemporary D/A converter systems available today are of the discrete type and comprise resistive ladder termination networks and operational amplifiers. These components result in a D/A converter of relatively large size and high cost. The resistive ladder network typically is fabricated in a matrix using diffused resistors or thin film resistors. Because the accuracy of these converters is directly proportional to the precision of the relative values of the resistors, much care is required in the fabrication thereof. Typically, however, the resistors must be trimmed in value, for instance, by laser trimming or other methods to meet the tolerance established for the system. This process is expensive and undesirous. Moreover, the ladder network makes it virtually impossible to fabricate such converters on a single monolithic chip. Therefore, a need exists for a D/A converter system which requires no such precision components as a resistive ladder termination network. Such a system could be fabricated on a single chip and require no trimming. Hence, size and cost could be reduced while maintaining system accuracy.

Another critical problem of the prior art is related to the inherent inaccuracies of operational amplifiers. The offset voltages associated with the operational amplifiers produce errors in these systems which must be compensated thereof. Typically, the prior art includes precision adjusting components to provide zeroing of the system and to eliminate the variations caused by the offsets of the amplifiers. These components further increase not only the size but the cost of the prior art systems. Moreover, these converters require constant adjustment to maintain system accuracy. Thus, it is desirous to eliminate the need for such precision components by providing a D/A converter having self zeroing and offset compensation. Where such self-correction is accomplished for each conversion cycle, sensitivity to temperature changes is minimized. Such a system would reduce cost, inaccuracies, eliminate any need for operator attention, and lend itself to being fabricated on a single chip to further reduce the size thereof, all of which are very desirous goals. Moreover, such a D/A converter could be fabricated using CMOS technology which would also reduce power drain to reduce power requirements.

In an attempt to overcome the deficiencies of the prior art discrete converters, one contemporary converter system eliminates the need for the ladder network, and is capable of being fabricated using MOS technology. However, this system suffers from several deficiencies. Most significantly, this system does not compensate for the offset voltages of the included operational amplifiers. These errors arise between the input digital signal and the generation of the output analog signal. In an attempt to overcome these errors, several successive conversion cycles are required by the system which, therefore, time limits the system. Additionally, both positive and negative reference voltages are required to provide conversion of binary numbers of both polarities. To insure accuracy, the system requires that these voltages be equal in absolute magnitude. This requires complex and precision power supplies which increase the cost of the system. Moreover, this system, to provide outputs of both polarities, requires the use of an internal up-down counter which further increases the system complexity and hence cost. Therefore, a need exists for a single chip, CMOS D/A converter which requires only a single reference voltage and which can provide analog outputs of both polarities therefrom, and which is self-correcting for each conversion cycle.

Furthermore, the above prior art converter is capable of only receiving digital input numbers in binary form and is limited to a six-bit input. Thus, there is a requirement for an improved converter which is adaptable to receive any type of binary coded number, i.e., BCD, binary or any other desired code. In conjunction therewith, the input of such a converter should not be limited to the number of input bits — except for practical realities.

SUMMARY OF THE INVENTION

Therefore it is an object of the present invention to provide an improved digital to analog converter.

It is another object of the invention to provide an improved D/A converter suitable to be fabricated in monolithic integrated circuit form utilizing CMOS technology.

A further object of the present invention is to provide a CMOS D/A converter having self zeroing and compensation which requires no adjustable or precision components.

A still further object is to provide a CMOS ladderless D/A converter for providing both polarity output signals which utilizes a single polarity reference voltage and which is adaptable to receive any desired binary coded input signal.

In accordance with the present invention, the foregoing and other objects are achieved by providing a D/A converter for converting a digital input signal to an analog output signal. The D/A converter of the invention includes input circuitry adapted to receive the digital input number for storing the same and for generating internal digital numbers which are compared to the stored input number. In response to coincidence being obtained therebetween, the input circuit produces a control signal. The D/A converter further includes analog circuitry adapted to receive a single reference voltage for integrating the same while the digital signals are being internally generated and compared to the stored digital number until, in response to the control signal being produced, integration is terminated. In addition, the output circuit includes dual channel sample/hold circuitry for sampling and holding the final voltage value obtained during integration of the conversion cycle. The analog output circuitry provides self zeroing and offset voltage compensation during each conversion cycle to eliminate errors which otherwise might occur and to which prior art converter systems suffer therefrom.

BRIEF DESCRIPTION OF THE DRAWINGS

FIG. 7 is a voltage diagram useful for explaining the operation of the linear subsystem of FIG. 2;

FIG. 8 is another voltage waveform useful for explaining the operation of the linear subsystem; and FIG. 9 illustrates particular configurations of the buffer-integrator and sample/hold sections for each of the operational cycles of the D/A converter of the present invention.

DETAILED DESCRIPTION OF THE PREFERRED EMBODIMENT

Figures 1, 3, 4:
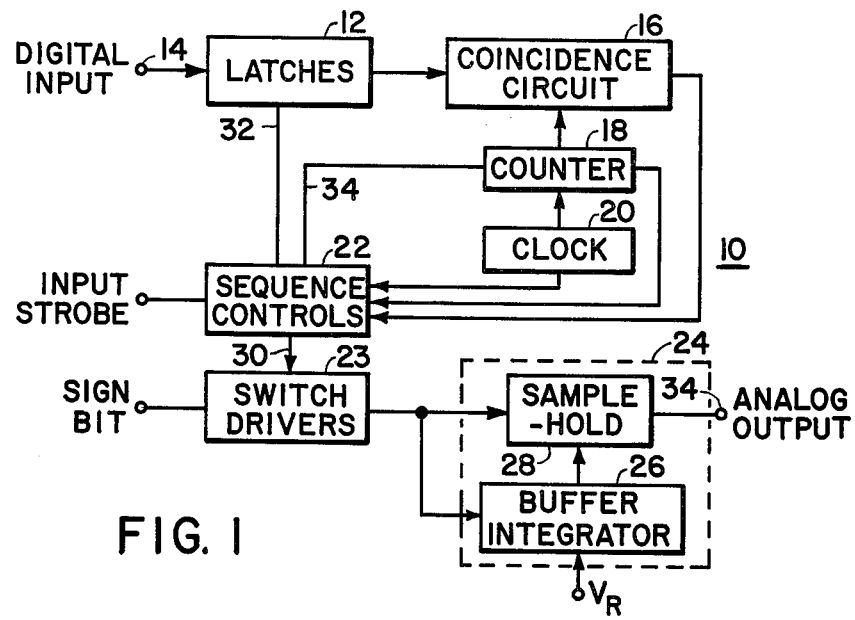
FIG. 1 is a functional block diagram of the D/A converter of the present invention.
FIG. 3 is a truth table indicating switch closures of the buffer-integrator section of the linear subsystem of FIG. 2 during each timing cycle of a conversion step.
FIG. 4 is a truth table indicating switch closures of a sample/hold section of the linear subsystem of FIG. 2.

Referring to FIG. 1, there is illustrated D/A converter 10 of the present invention which is suitable to be fabricated on a single monolithic integrated chip using CMOS technology. D/A converter 10 comprises storage latch bank 12 which is adapted to receive, at input terminal 14, input digital signals and for storing the same. It is to be understood that the digital signals may be applied in parallel or serially to the individual storage latches comprising latch bank 12. The digital signals may be in the form, for example, of binary coded digits (BCD), binary numbers or any other desired digital code. The output of latch 12 is coupled to coincidence circuit or comparator 16 which is also coupled to the output of counter 18, for instance a synchronous counter. A clock generator 20 is coupled to counter 16 for causing counting thereof. Counter 16 produces digital signals which are in the same code as the storage input digital signal and monotonically progresses from a "zero" count to a full count (the count corresponding to the largest input number applied at terminal 14). An output from clock 20 is also coupled to sequence control circuit 22 which is adapted to receive a strobe or start signal at the input thereof. Sequence control circuit 22 comprises the logic control circuits for controlling the logic functions of D/A converter 10. As will be explained, in response to applied control signals a control signal is provided at the output of sequence control circuit 22, via lead 30, to selectively render selected analog switches either open or closed through switch driver circuit 23. A sign bit, either a logic "1" or "0" is provided to the input of switch driver circuit 23 to control the particular configurations of buffer-integrator circuit 26 of linear subsystem 24. All of the foregoing circuits except for linear subsystem 24 may be considered as the input of D/A converter 10 with the latter comprising the analog output thereof. Besides buffer-integrator section 26, linear subsystem 24 is illustrated as including sample/hold section 28 comprising dual channels. Buffer-integrator section 26 is adapted to receive a single polarity and constant reference voltage which is provided "off-chip". As will be explained, one advantage of the present invention over the prior art is that the reference voltage, $V_R$, need not be a precise value. It is merely an external voltage which can be adjusted to any desired value.

Briefly, as will be explained in greater detail later, the conversion cycle from the digital input to an analog output comprises three distinctive cycles. Further, only the single reference voltage is required even though the desired analog output may be of either polarity, i.e., negative or positive. The sign bit, either a logic "0" or "1" sets the logic circuits to control the configuration of buffer-integrator section 26 such that the reference voltage is integrated either positive or negative to provide the derived output polarity. Digital input numbers are continually read into latch circuit 22 and the conversion step begins with cycle 1, when the strobe pulse is provided to sequence control circuit 22. The conversion cycle is then initiated and latch 22 inhibited by an inhibiting pulse, via lead 32, from sequence control circuit 22 such that the digital input number appearing coincidently to the input of the bank of latches is stored and cannot be altered. Simultaneously, synchronous counter 18 is reset to zero, via a command pulse over lead 34, and is allowed to clock through, for example, a full count during the first cycle. The time interval is a function of the period of the clocking signal provided by clock generator 20. During this time interval, linear subsystem 24 is preset to a quiescent operating condition which, as will be explained, eliminates analog errors during the following integration period (cycle 2). Upon termination of cycle 1, a full count having been obtained, an output pulse from counter 18 to sequence control circuit 22 is generated which resets and again enables counter 18 to begin cycle 2 of the conversion cycle. Simultaneously to the counter being enabled, buffer-integrator section 26 is placed in a configuration to integrate the externally provided reference voltage $V_R$. This action continues until the number contained in the counter coincides with the stored number, at which time coincident circuit 16 produces a coincident pulse which causes the integrator to stop integrating and to hold the final voltage acquired until this voltage is transferred into sample/hold circuit 28 to provide the output analog output voltage at output terminal 34. This output voltage is held constant until it is altered by the next conversion cycle.

As previously mentioned $V_R$ need not be a precise value. An operator may adjust the reference voltage to any full scale value (within the range of the system) desired. For instance, D/A converter 10 may be put in a set mode which allows counter 18 to count to full count simultaneously with the integrator integrating the reference voltage. The result is that the analog voltage so produced represents a full scale voltage. By adjusting $V_R$ in the set mode, the magnitude of full scale voltage is varied. When the system is then returned to the operate mode, the analog output voltage appearing at terminal 34 becomes the full scale voltage value times the ratio of the input digital number to the full scale count.

Figure 2:
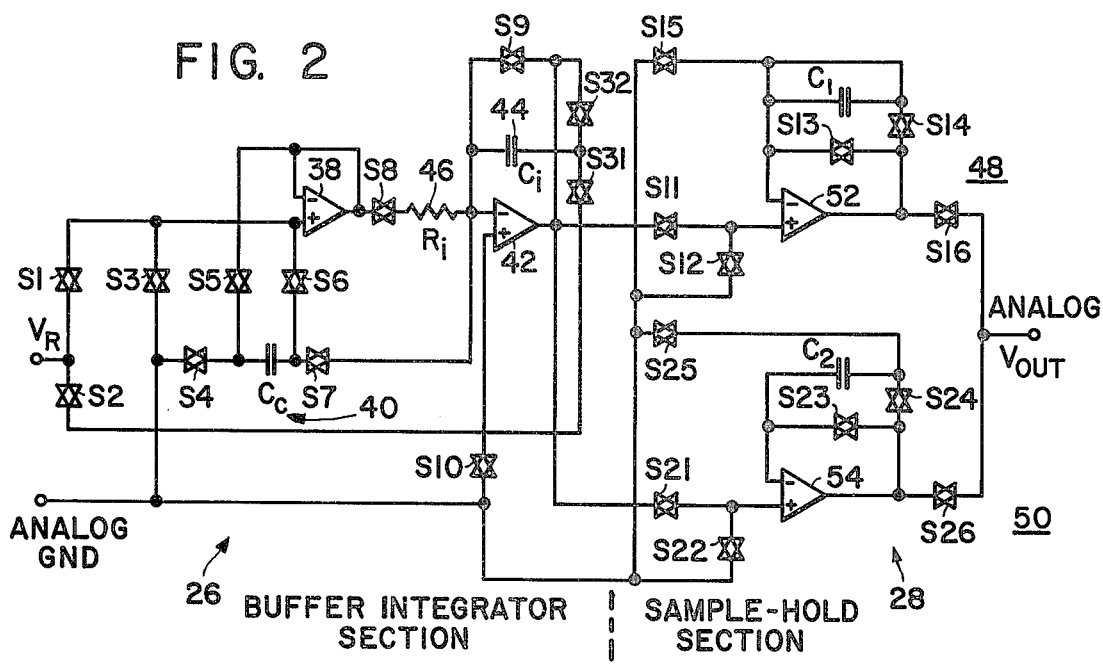
FIG. 2 is a circuit diagram of the linear subsystem of the D/A converter of FIG. 1.

Turning to FIG. 2, there is illustrated linear subsystem 24 in greater detail. Linear subsystem 24, including buffer-integrator section 26 and sample/hold section 28, consists of a plurality of transmission gates or switches S1, S2, S3 . . ., S32. The transmission gates are selectively rendered closed or open by logic control signals from sequence control circuit 22 to place buffer-integrator section 26 and sample/hold section 28 in particular configuration during the three distinct cycles of each conversion step.

The buffer portion of buffer-integrator section 26 consists of operational amplifier 38 and compensating capacitor 40 ($C_C$). The integrator portion of buffer integrator section 26 consists of operational amplifier 42, integrator capacitor 44 ($C_I$) and integrator resistor 46 ($R_I$). Sample/hold section 28 is illustrated as including identical dual channels 48 and 50. These channels include, respectively, operational amplifier 52, holding capacitor $C_1$, operational amplifier 54 and holding capacitor $C_2$. In both buffer-integrator section 26 and sample/hold section 28 the offsets of the operational amplifiers are compensated to eliminate errors which would otherwise be produced thereby.

FIGS. 3 and 4 are truth tables indicating the status of transmission gates or switches S1, S2, . . ., S32 of linear subsystem 10 for the timing cycles, 1, 2 and 3 of the conversion step. As an example, during cycle 2, switches S4, S6, S8, S10 and S32 of buffer integrator section 26 are closed. Simultaneously, depending on which of the dual channels is in the hold mode only while the other channel is in a hold plus display mode, selected switches of sample/hold circuit 28 are also closed.

Figure 5:
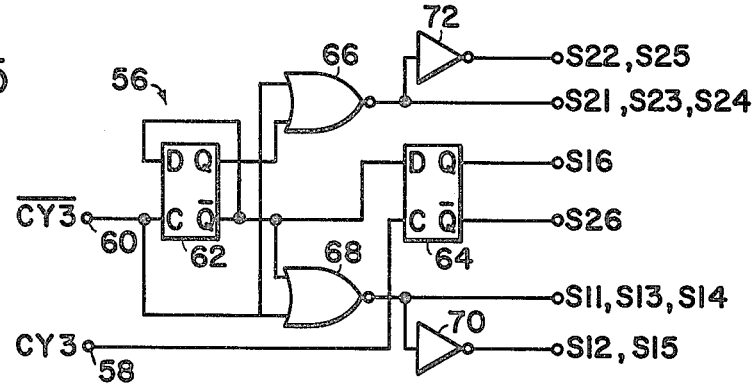
FIG. 5 is a circuit diagram of an exemplary logic control circuit for providing switch driving signals to the switches of the sample/hold section of FIG. 2.

FIG. 5 illustrates a sample logic driver which may be provided to control the states of the transmission gates of sample/hold section 28. As shown, logic driver 56 includes input terminals 58 and 60. Terminal 58 is adapted to receive an input pulse which may be, for example, derived when the coincidence pulse is initiated from comparator 16 to initiate cycle 3 of the conversion step. Simultaneously, the complement of this pulse is applied at terminal 60. These two signals are shown as CY3 and CY3 respectively. Logic drive 56 comprises two D-type flip-flops 62 and 64. Outputs of flip-flop 62 are selectively coupled to NOR gates 66 and 68 and to flip-flop 64. Logic drive signals are provided from the outputs of the circuit as well as inverters 70 and 72 to drive the transmission gates as shown. Similarly, logic control circuits generate switch driving signals to buffer-integrator section 26.

Figure 6:
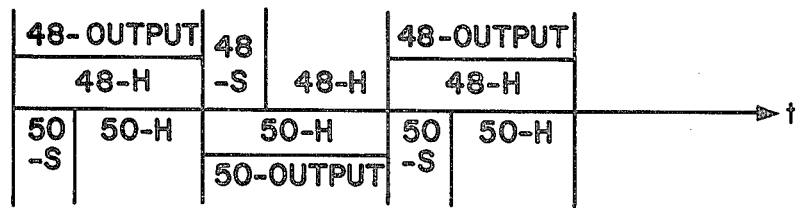
FIG. 6 is a sequence timing diagram illustrating the operation of the sample/hold section of the present invention.

FIGS. 6–8 represent timing sequence diagrams and waveforms for the three distinct cycles of the conversion step. Additionally, FIG. 9 illustrates the effective configurations of linear subsystem 24 during each of the three cycles as determined by the switch closures listed in the truth tables of FIGS. 3 and 4. Observing FIGS. 9A and 9B, note that different configurations are used for cycle 1 depending upon whether the output analog voltage is to negative or positive as determined by a logic "0" or "1" sign bit, respectively.

Referring to the Figures, a first digital to analog conversion cycle illustrating the operation of sample-hold circuit 28 will be explained and then the same for buffer-integrator section 26. The assumption is made that D/A converter 10 has been in operation such that prior to time $T_0$, the system is in a third cycle of the conversion step. Thus, coincidence has been obtained between the stored input number and the output of counter 18 which initiates cycle 3 and terminates integration by buffer-integrator section 26. Concurrently, sequence control circuit 22 produces an output pulse, CY3 and its complement, CY3, which are applied to respective input terminals 58 and 60 of switch logic control circuit 56 (FIG. 5). It is to be understood that the time duration of cycle 3 is maintained substantially constant in the preferred embodiment. This may be accomplished by utilizing an auxiliary counter which is enabled to count to a full count which then causes termination of the CY3 control signal from sequence control circuit 22. In response to the cycle 3 control signals, the transmission gates S11, S12, . . ., S26 of sample/hold section 28 are selectively closed as indicated in the truth table of FIG. 4 such that the configuration of channel 48 and 50, for example, are as shown in FIG. 9E. In this condition, as indicated in FIG. 6, channel 50 is in the sample mode and channel 48 is in a hold mode and is connected to output terminal 34. Integrator amplifier 42 is disconnected from buffer amplifier 38 by the selective closures of the switches of buffer integrator section 26 as illustrated by truth table of FIG. 3 and the final value of the previous cycle 2 is held constant at the output of the integrator and is sampled by channel 50 of sample/hold circuit 28.

At time $T_0$, cycle 1 is initiated by strobing the input of sequence control circuit 22. The CY3 control signal is then inhibited which causes both channels 48 and 50 to be placed in a hold configuration. However, as illustrated by either FIG. 9A or 9B, and FIG. 6, channel 48 remains connected to the output of D/A converter 10 while channel 50 is placed in a hold configuration but not connected to the output.

Sample/hold section 28 remains in this particular configuration during cycle 2, times $T_0$–$T_2$. As an aside, because both channels are disconnected from buffer-integrator section 26, the output from D/A converter 10 remains constant and will not vary during conversion cycles 1 and 2. At time $T_2$, another cycle 3 is initiated which causes channel 48 to be placed in a sample mode to sample the final value held by integrator amplifier circuit 42 and is simultaneously disconnected from output terminal 34. However, channel 50 remains in the hold mode but is simultaneously connected to output terminal 34 to produce thereat the analog voltage sample thereby during cycle 3 of the previous cycle which occurred prior to time $T_0$ (FIG. 9D). At $T_3$, another cycle 1 is initiated and both channels 48 and 50 are disconnected from integrator amplifier 42 and put in a hold mode. Channel 50 remains connected to output terminal 34. This state remains until time, $T_5$, at which a third cycle is again initiated and the previous conversion states are produced.

In brief summary of the above, it is seen that each channel of sample/hold circuit 28 samples during a predescribed cycle 3, holds during the following cycles 1 and 2 and is connected to the output of the D/A converter during the next three cycles. This sequence of states alternates for the two channels such that one channel is always in an output state while the other samples and holds the integrated analog voltage generated during the conversion process. The insertion of a hold state between the sample and output state allows the system to settle to its final value before providing an output voltage. It should be noted that an obvious alternate configuration for some applications would be to eliminate the hold state between sample and output states. This can be accomplished with a simple change in logic control circuit 56. For example, by eliminating flip-flop 64 and providing direct connections from the Q and Q outputs of flip-flop 62 to respective switches S26 and S16, the hold state between sampling and output display would be eliminated.

Turning now to buffer-integrator section 26, the effective configurations thereof are different in each of the three cycles as determined by the selection of particular transmission gates or switches as illustrated in the truth table of FIG. 3. Considering first the case of a negative input digital signal (sign bit=0) during cycle 1 (when counter 18 is counting through a full count) both buffer amplifier 38 and integrator amplifier 42 are placed in a voltage follower configuration as illustrated in FIG. 9A. The noninverting input of buffer amplifier 38 is connected to the reference voltage $V_R$. Compensating capacitor $C_c$ is serially coupled between buffer amplifier 38 and integrator amplifier 42. Integrator capacitor $C_i$ is coupled between the inverting and noninverting terminals of integrator amplifier 42 and, as will be explained, is charged to an initial quiescent value during the cycle 1 conversion step. The purpose of buffer amplifier 38 is to provide integrator current and charging current for compensating capacitor $C_c$.

If the digital input number is positive (sign bit=1), as illustrated in FIG. 9B, the roles of buffer amplifier 38 and integrator amplifier 42 are reversed and $V_R$ is applied to the noninverting terminal of integrator amplifier 42. However, both amplifiers are placed in a voltage follower configuration. Furthermore, as observed, the reference voltage $V_R$ component charges capacitor $C_c$ in a reverse polarity to that of the FIG. 9A configuration which causes integration in a negative sense during cycle 2. Note that cycle 2 and cycle 3 configurations for the buffer and integrators do not change with polarity.

Referring to FIGS. 7 and 9A for the case of sign bit=0, during cycle 1, the output voltage $V_0$ from integrator amplifier 42 is equal to the offset voltage of amplifier 42 ($E_2$). Between $T_0$ and $T_1$, capacitor $C_c$ is charged to a voltage $V_{AB}$ which is a function of the reference voltage $V_R$ and the offset voltages of amplifiers 38 and 42. During cycle 2, buffer-integrator section 26 is configured as illustrated in FIG. 9C, and the voltage $V_{AB}$ constitutes the input to buffer amplifier 38 which in turn provides the integrating current to integrator 42. As will be explained, the offset voltage $E_2$ is compensated therefore, such that $V_0$ becomes equal to zero at time $T_1$. Integration proceeds in a positive sense between $T_1$-$T_2$, portion 78 of waveform 76, until coincidence is obtained and integration is terminated by initiation of cycle 3. Integrator amplifier 42 is then separated from buffer amplifier 38 and placed in a hold configuration such that the final voltage value of $V_0$ is held, waveform portion 80. During cycle 3, between times $T_2$ and $T_3$, the final voltage value obtained during cycle 2 is sampled by the selected one of either channel 48 or 50 of sample/hold circuit 28. At the start of the next conversion cycle, if the input number remains negative, the input (non-inverting terminal) of the integrator is returned to ground which causes the voltage $V_0$ to be at the same potential so that the initial quiescent operating condition is the same for the start of each conversion. As illustrated by waveform 82, if the input digital number remains constant through succeeding conversion steps, and if the number is negative, the analog output voltage, $V_{out}$, remains constant and negative and is representative of the digital number.

The operation of buffer-integrator section 26 is the same as the foregoing discussion when the digital number is positive except that the non-inverting input terminal of integrator amplifier 42 is returned to the reference voltage at the beginning of each cycle 1 which establishes the initial output voltage $V_0$ equal to $V_R$ plus the offset voltage $E_2$ of amplifier 42 (waveform 84, FIG. 8). At time $T_1$, the voltage established across capacitor $C_i$ during cycle 1 compensates for the offset voltage of amplifier 42 such that with the non-inverting input of the integrator returned to ground, portion 86, $V_0$ becomes equal to zero and integration proceeds negatively, portion 88 of waveform 84. The voltage $V_0$ reaches a final negative value at time $T_2$ and is held constant as before. Because the output of the sample/hold circuit is the inverse of the input thereto, $V_{out}$ is positive and corresponds to the input number, waveform 90.

As previously mentioned, in both the buffer-integrator section 26 and sample/hold section 28, the offset voltages of the operational amplifiers are compensated. Referring to the particular configurations of these sections as illustrated in FIG. 9, the foregoing self-compensating provision can be discussed.

It is known that for an op amp in a voltage follower configuration that:

$$E = (A/A-1) E_{os}$$

where E is the resulting voltage from the non-inverting terminal to the output, $E_{os}$ is the input offset voltage and A the open loop gain. With A very large, which is the normal case for an op amp, the output voltage E becomes equal to the offset voltage.

Now, considering the case of a negative input number (sign bit=0), the configuration of buffer integrator section 26 is as illustrated in FIG. 9A. In this configuration it can be shown that the voltage $V_{AB}$ produced across capacitor $C_c$ is:

$$V_{AB} = V_R + E_1 - E_2 \tag{1}$$

Also, in this configuration, capacitor $C_i$ is charged to an initial voltage equal to $E_2$ which is the offset voltage of amplifier 42. At the beginning of cycle 2, the buffer-integrator section is configured as illustrated in FIG. 9C and the voltage $V_{AB}$ becomes the input voltage to buffer amplifier 38. It can be shown that if the initial voltage on $C_i$ were zero, the integrator output voltage $V_0$ would be:

$$V_0 = E_2 + (1/R_iC_i) \int_0^T V_R \, dt \tag{2}$$

and $$V_0 = E_2 + V_R T/R_i C_i \tag{3}$$

However, as capacitor $C_i$ is initially charged during cycle 1 to the value $E_2$ and is of opposite polarity to the $E_2$ term of equation 3, these two terms cancel each other such that the final value of the voltage $V_0$ is proportional to the full scale reference voltage $V_R \times T$, where T is the time interval required for obtaining coincidence. In a similar manner, the offset voltages are cancelled when the input digital number is positive.

Turning to sample/hold circuit 28, as illustrated in FIG. 9D, channel 48 is in a sample mode and channel 50 in hold mode. In a sample mode, the voltage V across capacitor $C_1$ equals:

$$V = V_{in} + E_{os} \tag{4}$$

where $V_{in}$ is the input voltage from integrator 42 and $E_{os}$ equals the offset voltage of the amplifier. In the hold mode, the output voltage, $V_{out}$ (FIG. 9A) is $$V_{out} = E_{os} - V \quad (5)$$

or, from equation 4

$$V_{out} = E_{os} - V_{in} - E_{os} = -V_{in} \quad (6)$$

Hence, from equation 6 it is observed that the output voltage from the sample/hold channel is the inverse of the input voltage and the offset voltage is cancelled.

In summary, the D/A converter of the present invention converts either positive or negative digital input signals to analog output signals of respective polarities. The conversion process functions in three distinct cycles:

CYCLE 1:

A. Digital input is read in and stored.
B. $C_c$ is charged with $V_{REF}$ and the op amp offset compensating voltages.
C. $C_i$ is charged to the integrator offset voltage.

CYCLE 2:

A. Voltage stored on $C_c$ is integrated until contents of the counter, which is counting concurrently with the integration, coincides with the stored input digital number. This stops integration.

CYCLE 3:

A. Final voltage on the integrator is held while the sample/hold circuit samples.

The converter of the present invention provides several significant advantages over the prior art. Good conversion accuracy is obtained with self zeroing and self compensating for operational amplifiers provided; there is no requirement for manual adjustment or precision components. The converter system is equally adaptable to BCD, binary or any other desired input digital code and uses a single polarity off-chip reference voltage which can be adjusted to scale the analog output voltage range to any desired value. As the converter is suitable to be fabricated using CMOS techniques, the converter requires low power consumption.

What is claimed is:

1. Apparatus for converting an input digital signal into an analog output signal, comprising:
   means receiving the input digital signal for storing the same during a conversion cycle;
   counter means for producing digital signals;
   comparator means for comparing the stored input digital signal and said digital signals produced by said counter means to provide an output signal therefrom upon coincidence occurring therebetween;
   integrator means receiving a single polarity reference voltage for integrating the same during said conversion cycle such that an analog signal is produced at the output of said integrator means which is representative of both the magnitude and polarity of the stored input digital signal, said integrator means including a buffer circuit, first charge storage means, and an integrator circuit;
   sample and hold circuit means for sampling the analog signal appearing at said output of said integrator means during predetermined times during said conversion cycle and then holding the value of said sampled analog signal to provide the analog output signal at an output thereof;
   control circuit means responsive to an applied input signal for initiating said conversion cycle and for selectively enabling and disabling said counter means, said integrator means and said sample and hold circuit means during distinct portions of said conversion cycle, said control circuit means causing said buffer circuit, said first charge storage means and said integrator circuit to be coupled in a first configuration during a first portion of said conversion cycle such that said reference voltage is applied thereto to charge said first charge storage means, the polarity of said charge across said first charge storage means being in accordance with the polarity of said stored input digital signal, said control circuit means causing said counter means to be activated during a second portion of said conversion cycle, said control circuit means causing said buffer circuit, said first charge storage means and said integrator circuit to be coupled in a second configuration during said second portion of said conversion cycle such that said charge across said first charge storage means is integrated by said integrator circuit to produce said analog signal, said control circuit means being responsive to said output signal from said comparator means to terminate said second portion and to initiate a third portion of said conversion cycle, said control circuit means causing said first charge storage means and said buffer circuit to be decoupled from said integrator circuit during said third portion such that the value of said analog signal appearing at said output of said integrator means is maintained during said third portion of said conversion cycle; and
   said control circuit means selectively coupling and then decoupling said sample and hold circuit means to said integrator means during said third portion and said first and second portions respectively of said conversion cycle.

2. The apparatus of claim 1 wherein:
   said buffer circuit includes a first operational amplifier;
   said integrator circuit includes a second operational amplifier and a second charge storage means;
   said first charge storage means being charged to said reference voltage plus any error voltages produced by said first and second operational amplifier during said first portion of said conversion cycle to provide self compensation to said error signals generated by said first and second operational amplifiers; and
   said second charge storage means being charged to the offset voltage of said second operational amplifier during said first portion of said conversion cycle.

3. The apparatus of claim 2 wherein said sample and hold circuit means includes:
   a first sample and hold circuit;
   a second sample and hold circuit;
   said control circuit means selectively causing said first and second sample and hold circuits to be respectively coupled to said integrator means to sample said analog signal during said third portion of said conversion cycle and then decoupled from said integrator means and coupled to an output terminal of the apparatus for causing said output analog signal to appear thereat during the first and second portions of a subsequent conversion cycle.

4. The apparatus of claim 3 wherein said first sample and hold circuit includes:
   a third operational amplifier;
   third charge storage means;
   a plurality of switches rendered selectively open and closed by said control means for placing said third operational amplifier and said third charge storage means in a sample mode configuration when said analog signal appearing at said output of said integrator means is sampled by said first sample and hold circuit and for placing the same in a hold mode configuration when said first sample and hold circuit is coupled to said output of the apparatus to cause the value of the output analog signal appearing thereat to be maintained during respective conversion cycle.

5. The apparatus of claim 3 wherein said second sample and hold circuit includes:
   a fourth operational amplifier;
   fourth charge storage means;
   a plurality of switches rendered selectively open and closed by said control circuit means for placing said fourth operational amplifier and said fourth charge storage means in a sample mode configuration when said analog signal appearing at said output of said integrator means is sampled by said second sample and hold circuit and for placing the same in a hold mode configuration when said second sample and hold circuit is coupled to said output of the apparatus to cause the value of the output analog signal appearing thereat to be maintained during a respective conversion cycle.

6. A digital to analog converter suitable to be fabricated in monolithic integrated circuit form, comprising:
   control circuit means responsive to the initiation of a conversion cycle for producing a plurality of sequence control signals;
   storage means for storing an input digital signal applied thereto upon initiation of said conversion cycle, said storage means storing said input digital signal in response to receiving first sequence control signals from said control circuit means;
   buffer-integrator means receiving a single polarity reference signal for causing integration of the same in a positive or negative sense dependent upon the polarity of said input digital signal to produce an analog signal at an output, said analog signal being representative of the magnitude and polarity of said stored input digital signal, said buffer-integrator means including first and second amplifiers, a plurality of switches, first and second capacitors, said first and second capacitors being external to said buffer-integrator means, said switches being rendered open and closed in response to second sequence control signals applied thereto from said control circuit means during a first portion of said conversion cycle to couple said first and second capacitors with said first and second amplifiers in such a manner that said first capacitor is charged to the value of said reference signal plus any error signals produced by said first and second amplifiers and said second capacitor being charged to any error signals produced by said second amplifier such that self-compensation to said error signals is provided during said conversion cycle, said switches being rendered selectively open and closed by third sequence control signals from said control circuit during a second portion of said conversion cycle such that said first and second amplifiers are intercoupled to said first and second capacitors wherein the charge across said first capacitor is integrated by the circuit including said second amplifier and said second capacitor to produce said analog signal, said switches being rendered selectively open and closed by fourth sequence control signals from said control circuit means to cause said analog signal appearing at said output of said buffer-integrator means to be maintained during a third portion of said conversion cycle;
   coincidence means responsive to the initiation of said second portion of said conversion cycle for generating digital signals and for comparing said generated digital signals to said stored input signal to provide an output signal upon coincidence occurring therebetween, said output signal being applied to said control circuit means to cause termination of said second portion of said conversion cycle; and
   sample and hold circuit means responsive to sequence control signals being applied thereto from said control circuit means for selectively sampling said analog signal appearing at said output of said buffer-integrator means during said third portion of said conversion cycle and for applying and maintaining said sampled analog signal at an output of the digital to analog converter.

7. The digital to analog converter of claim 6 wherein said sample and hold circuit means includes:
   a first sample and hold circuit;
   a second sample and hold circuit;
   additional switches interposed between said first and second sample and hold circuits, said additional switches being rendered selectively open and closed by sequence control signals from said control circuit means for selectively coupling said first and second sample and hold circuits to said buffer-integrator means during the third portion of successive cycles and for alternately coupling the outputs of said first and second sample and hold circuits to said output of the digital to analog converter during the first and second portions of respective conversion cycles.

* * * * *